United States Patent [19]

Beesley

[11] 4,352,030

[45] Sep. 28, 1982

[54] PULSE DETECTORS

[75] Inventor: Graham E. Beesley, Basingstoke, England

[73] Assignee: Motorola, Inc., Schaumburg, Ill.

[21] Appl. No.: 130,932

[22] Filed: Mar. 17, 1980

[30] Foreign Application Priority Data

Apr. 30, 1979 [GB] United Kingdom ............... 7914882

[51] Int. Cl.³ .................... H03K 5/153; G01R 19/165
[52] U.S. Cl. .................................. 307/350; 307/359; 328/151
[58] Field of Search ...................... 307/351, 358, 359; 328/149, 151

[56] References Cited

U.S. PATENT DOCUMENTS

| | | | |
|---|---|---|---|
| 3,073,968 | 1/1963 | Tribby | 307/351 |
| 3,628,063 | 12/1971 | Tamari | 307/519 |
| 3,737,790 | 6/1973 | Brown | 307/358 |

*Primary Examiner*—John Zazworsky

*Attorney, Agent, or Firm*—Sang Ki Lee; James W. Gillman; Edward M. Roney

[57] ABSTRACT

A tracking pulse detector comprising a feedback loop and means for adjustment of the detector bias to compensate for varying input signal levels whereby noise signals present at the input of the detector are maintained below the detector threshold thereby rendering the detector immune to false triggering. An AGC output is taken from a junction between resistors of a voltage divider and a capacitor is connected between the AGC output line and an OV line, the AGC voltage output being related to the total carrier level. The average current in the detector is kept approximately constant independently of supply and signal conditions and the feedback loops adjusts the DC bias of the detector to compensate for varying signal levels, thereby keeping any input noise signals below the detector threshold independent of the level of slow varying carriers. Any carrier level variation faster than the feedback loop time constants are detected.

3 Claims, 2 Drawing Figures

4,352,030

PULSE DETECTORS

BACKGROUND OF THE INVENTION

This invention relates to pulse detectors and an object of the invention is to stabilize the threshold in a detector thereby eliminating false triggering caused by input noise being detected when the threshold shifts due to carriers at the input changing the DC condition.

The pulse detector of the present invention may be used as a pulse detector in a radio receiver circuit employing a noise blanking circuit such as described in co-pending U.S. patent application Ser. No. 129,927 filed on Mar. 13, 1980 and assigned to the same assignee to which the present application is assigned but the present detector is not limited to such a particular application and may be used generally e.g. in radar wherever false triggering occurs due to the presence of carrier signals at the input.

SUMMARY OF THE INVENTION

According to one aspect of the invention there is provided a pulse detector comprising a feedback loop including means for adjustment of the detector DC bias to compensate for varying input signal levels, whereby noise signals present at the input of the detector are maintained below the detector threshold thereby rendering the detector immune to false triggering.

According to a further aspect of the invention there is provided a pulse detector responsive to radio frequency input signals and including a feedback loop to adjust the DC bias of the detector to compensate for varying signal input levels and to produce an AGC voltage output related to the total carrier level, the detector being rendered immune to false triggering by maintaining the detector threshold.

BRIEF DESCRIPTION OF THE DRAWINGS

The invention will now be described by way of example only with particular reference to the accompanying drawings wherein.

DETAILED DESCRIPTION OF THE INVENTION

Figure 1:
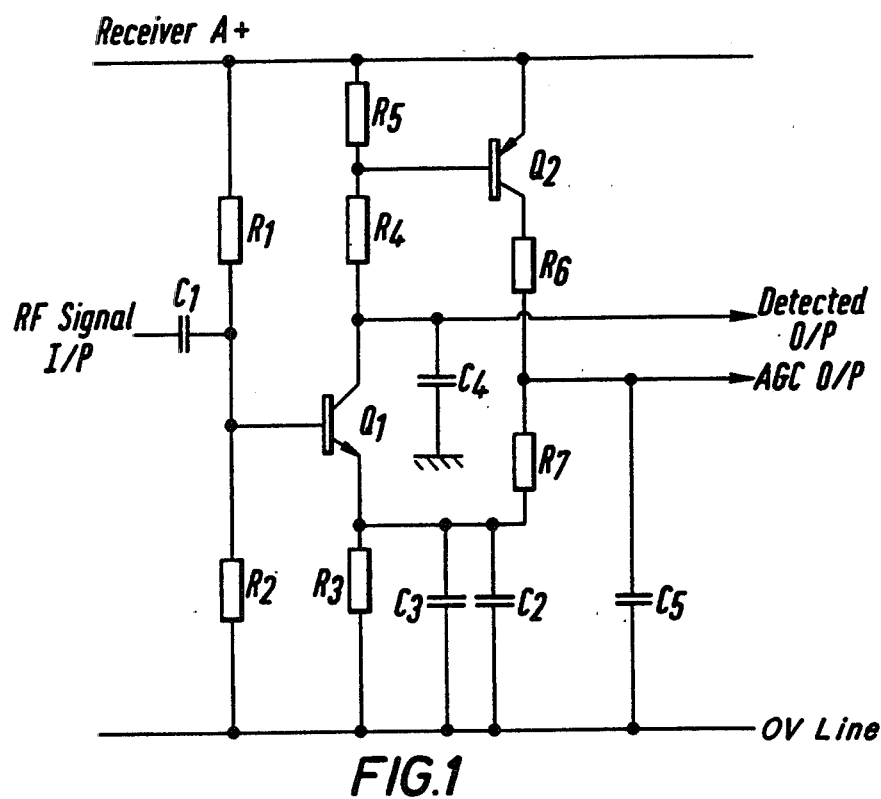
FIG. 1 is a detailed circuit of a tracking pulse detector.

The pulse detector shown in the drawings is particularly for use as a blanker pulse detector in a noise blanker radio receiver circuit such as described in said co-pending the above-identified U.S. patent application Ser. No. 129,927 but as previously indicated, the detector has more general application to render the detector immune to false triggering caused by input noise being detected when the threshold of the detector shifts.

In the detector shown in the drawings, the tracking pulse detector is operated at a low current in a feedback loop. The average current in the detector is kept approximately constant independent of supply and signal conditions. The feedback loop adjusts the detector DC bias to compensate for varying signal levels. Noise present at the input is thus kept below the detector threshold independent of the level of slow varying carriers. Any carrier level variation faster than the feedback loop time constants are detected. An AGC voltage related to total carrier level is produced.

Thus, referring to FIG. 1, RF signals e.g. from an RF amplifier receiving signals from an antenna are applied to the base of transistor $Q_1$ via capacitor $C_1$, a voltage divider comprising series resistors $R_1$, $R_2$ being connected to the base of transistor $Q_1$ and between the positive and 0V lines. The emitter of transistor $Q_1$ is connected to the 0V line via resistor $R_3$ which is connected in parallel with capacitors $C_2$, $C_3$. A fourth capacitor $C_4$ is connected between the collector of transistor $Q_1$ and ground. Resistor $R_4$ which in current detectors is connected to the collector of transistor $Q_1$, is connected in the detector of the present invention, between the collectors of transistor $Q_1$ and the base of a second transistor $Q_2$ and in series with resistor $R_5$ to form a voltage divider. Voltage divider resistors $R_6$, $R_7$ are connected in series between the collector of transistor $Q_2$ and the emitter of transistor $Q_1$, the transistor $Q_2$ and resistors $R_6$, $R_7$ forming the aforementioned feedback loop. The emitter of transistor $Q_2$ is connected to the positive line and the AGC output is taken from the junction between resistors $R_6$, $R_7$, a further capacitor $C_5$ being connected between the AGC output line and the 0V line.

In the quiescent state of the detector, transistor $Q_1$ is forward biased by voltage divider chain $R_1$, $R_2$, and causes the current to flow through resistor $R_4$ and the base of transistor $Q_2$. Transistor $Q_2$ amplifies this base current and increases the voltage across resistor $R_3$ which increases the voltage on the emitter of transistor $Q_1$, and hence reduces the forward bias of transistor $Q_1$. The current in transistor $Q_1$ diminishes until a balance point is reached such that transistor $Q_1$ is passing the small base current of transistor $Q_2$, plus the current in resistor $R_5$ which after amplification by transistor $Q_2$ is providing the bias across resistor $R_3$. This provides automatic setting of transistor $Q_1$, at the bias point required to provide detection, i.e. just forward biased.

For detection, when a burst of RF is applied to the base of transistor $Q_1$, positive going cycles cause the collector current to decrease the potential on capacitor $C_4$ whilst negative going cycles reverse bias transistor $Q_1$ ($R_4C_4 << TRF$), TRF is an acronym for tuned radio frequency. This acronym is used for a type of radio receiver where all the selectivity is accomplished at the signal frequency, and detection also occurs at that frequency. Noise blanker receivers are usually TRF types. The bias on the emitter of transistor $Q_1$ remains fixed due to the long time constants of resistors $R_6$, $R_7$ and capacitor $C_5$ and resistor $R_3$ and capacitors $C_3$, $C_2$. A negative going envelope is thus produced across capacitor $C_4$.

When a steady carrier or continuous noise is impressed on the base of transistor $Q_1$, the current through resistor $R_4$ increases and after the time required by time constants $R_6$, $R_7$, $C_5$; $R_3$, $C_2$, $C_3$; the bias on the emitter of transistor $Q_1$ is raised to bias transistor $Q_1$ such that only the peaks of the input are detected by the transistor $Q_1$ to provide the new bias current in transistor $Q_2$. This corresponds to a small change in DC voltage on capacitor $C_4$. Additionally, the bias change required to adjust transistor $Q_1$ to detection of wave peaks, is reflected as an amplified shift in the DC voltage on capacitor $C_5$. This is the AGC output.

Transistor $Q_1$ is now operating at a slightly larger bias but still is essentially just forward biased and hence can detect any rapid increase in carrier level i.e. an impulsive noise burst.

The bias point required by the detector is just forward biased. If the detector is operated reverse biased, it exhibits a threshold and is hence less sensitive. If the detector is operated well forward biased, it no longer detects, but acts as an amplifier and low pass filter with no detection characteristic. If a carrier were allowed to shift the detector's operating point towards well forward biased, it would first detect the noise present alongside the carrier as a slight modulation i.e. it would have no noise threshold protection, and eventually would be desensitized by the forward biasing.

As previously indicated, the pulse detector of the present invention may be used in a radio receiver circuit employing noise blanking. In a noise blanker radio, the effect of bias point shift due to a carrier allowing the noise to appear as a modulation output, is called false noise triggering and can send a noise blanker radio into rate shut off as the noise bandwidth is of the order of hundreds of kilohertz.

Figure 2:
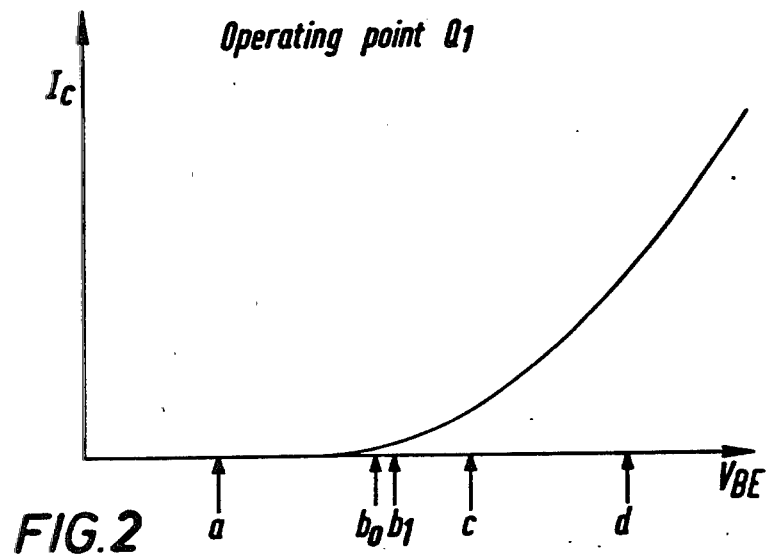
FIG. 2 is a diagram showing the operating point characteristic of a transistor of the detector of FIG. 1 with the collector current $I_c$ plotted to a base of base/emitter voltage $V_{BE}$.
Figure 1:
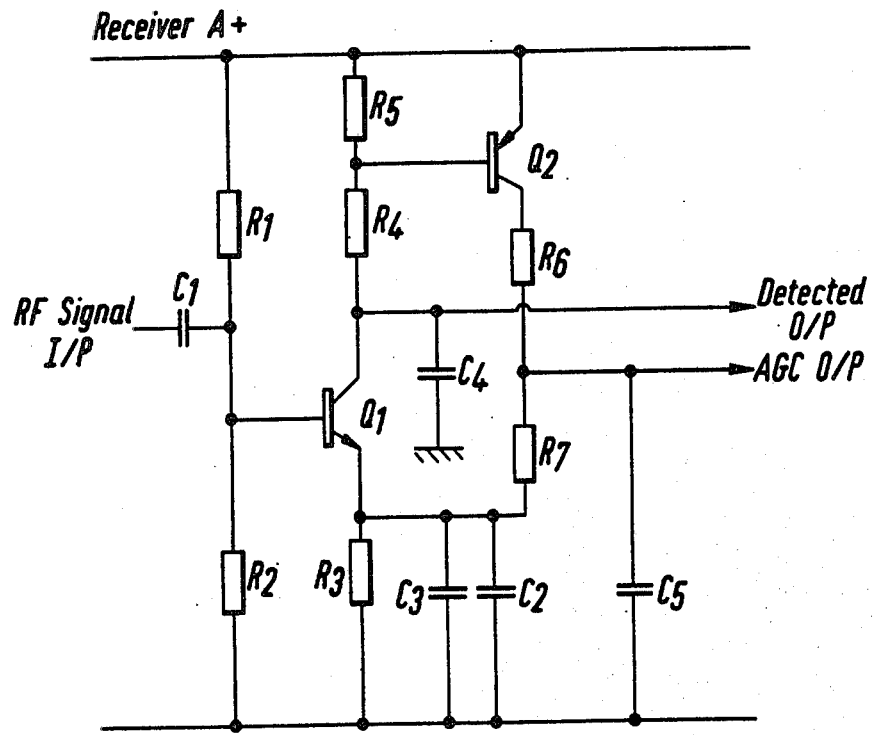
Figure 2:
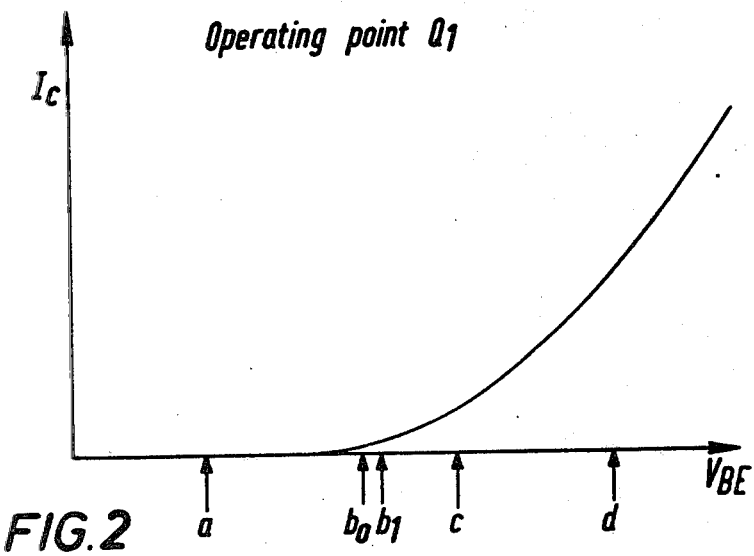

As shown in FIG. 2 where the collector current of transistor $Q_1$ is plotted to a base of the potential between the base and emitter electrodes thereof, when the detector is reverse biased, a large threshold is exhibited as shown at (a). As shown at ($b_0$) in the quiescent state the detector exhibits low gain to small excursions (noise). A shift in the operating point to ($b_1$) in the presence of a carrier with the tracking detector of the present invention still provides low gain to small excursions (noise). At point (c) there is considerable gain to noise for a non-tracking detector and hence noise is seen by subsequent stages and causes false triggering. The characteristic at point (d) shows the detector desensitized i.e. no longer operating as a detector in the presence of a large carrier.

The base of transistor $Q_2$ may be additionally utilized to provide a gain control point for intermodulation protection and level shut off from the main receiver but this feature is not illustrated in FIG. 1.

It will be appreciated that the invention is susceptible to considerable modification and is not to be deemed limited to the particular circuit details described by way of example only.

I claim:

1. A detector for detecting radio frequency input signals with varying signal levels and slowly varying carriers, comprising:

positive voltage supply line;
zero voltage supply line;
an amplifying circuit including a first transistor for receiving and amplifying the radio frequency input signals;
a first capacitor coupled to the base electrode of said first transistor for applying the radio frequency input signals to said first transistor;
biasing means for providing a DC bias to put said first transistor into quiescent conducting state, said biasing means including a first voltage divider being connected to the base electrode of the first transistor and between said positive and zero voltage lines;
resistive-capacitive means coupled between the emitter electrode of said first transistor and zero voltage supply line;
a second voltage divider coupled between the collector electrode of said first transistor and positive supply voltage line;
a second capacitor coupled between the ground and collector electrode of said first transistor;
a second transistor, the base electrode of which is coupled to said second voltage divider and the emitter electrode of which is coupled to said positive voltage supply line; and
a third voltage divider connected between the emitter electrode of said first transistor and the collector electrode of the second transistor, wherein said second transistor and said third voltage divider form a feedback loop, and wherein said feedback loop coupled to said amplifying circuit adjusts the level of the DC bias applied to the amplifying circuit by said biasing means to compensate for the variation in the input signal level, whereby noise signals applied at the input of said amplifying circuit are maintained below the threshold at which said first transistor conducts and thereby renders the detector immune to false triggering due to noise and makes the detector independent of the level of slowly varying carriers of the radio frequency input signals.

2. The detector according to claim 1, the detected output of which is taken from the collector electrode of said first transistor.

3. The detector according to claim 1, an AGC (automatic gain control) output is taken from said third voltage divider.

* * * * *